(12) United States Patent
Song

(10) Patent No.: US 11,521,664 B2
(45) Date of Patent: Dec. 6, 2022

(54) MEMORY DEVICE WITH TUNABLE PROBABILISTIC STATE

(71) Applicant: Taiwan Semiconductor Manufacturing Co., Ltd., Hsin-Chu (TW)

(72) Inventor: Ming Yuan Song, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 319 days.

(21) Appl. No.: 16/933,132

(22) Filed: Jul. 20, 2020

(65) Prior Publication Data
US 2021/0065762 A1 Mar. 4, 2021

Related U.S. Application Data

(60) Provisional application No. 62/894,396, filed on Aug. 30, 2019.

(51) Int. Cl.
| | |
|---|---|
| *G11C 11/16* | (2006.01) |
| *H01L 27/22* | (2006.01) |
| *H01L 43/08* | (2006.01) |
| *H01L 43/02* | (2006.01) |

(52) U.S. Cl.
CPC ........ *G11C 11/1675* (2013.01); *G11C 11/161* (2013.01); *G11C 11/1659* (2013.01); *G11C 11/1693* (2013.01); *H01L 27/228* (2013.01); *H01L 43/02* (2013.01); *H01L 43/08* (2013.01)

(58) Field of Classification Search
None
See application file for complete search history.

(56) References Cited

U.S. PATENT DOCUMENTS

| 9,734,880 B1 | 8/2017 | Augustine et al. |
| 9,953,690 B2 | 4/2018 | Augustine et al. |
| 2009/0180312 A1 | 7/2009 | Miura et al. |

(Continued)

FOREIGN PATENT DOCUMENTS

JP 2017157581 A 9/2017

OTHER PUBLICATIONS

Jia et al. "Spintronics Based Stochastic Computing for Efficient Bayesian Inference System." IEEE Transactions on Computer-Aided Design of Integrated Circuits and Systems (vol. 39, Issue: Apr. 4, 2020), published on Feb. 5, 2019.

(Continued)

*Primary Examiner* — Tan T. Nguyen
(74) *Attorney, Agent, or Firm* — Eschweiler & Potashnik, LLC

(57) ABSTRACT

Some embodiments relate to a probabilistic random number generator. The probabilistic random number generator includes a memory cell comprising a magnetic tunnel junction (MTJ), and an access transistor coupled to the MTJ of the memory cell. A variable current source is coupled to the access transistor and is configured to provide a plurality of predetermined current pulse shapes, respectively, to the MTJ to generate a bit stream that includes a plurality of probabilistic random bits, respectively, from the MTJ. The predetermined current pulse shapes have different current amplitudes and/or pulse widths corresponding to different switching probabilities for the MTJ.

20 Claims, 5 Drawing Sheets

(56) References Cited

U.S. PATENT DOCUMENTS

| | | |
|---|---|---|
| 2010/0109660 A1* | 5/2010 | Wang .................... G11C 11/161 |
| | | 324/244 |
| 2010/0131578 A1 | 5/2010 | Fukushima et al. |
| 2011/0273926 A1 | 11/2011 | Wu et al. |
| 2013/0073598 A1 | 3/2013 | Jacobson et al. |
| 2013/0234266 A1 | 9/2013 | Prejbeanu et al. |
| 2013/0245999 A1 | 9/2013 | Banerjee et al. |
| 2014/0056060 A1 | 2/2014 | Khavalkovskiy et al. |
| 2014/0222880 A1 | 8/2014 | Wu et al. |
| 2017/0263299 A1 | 9/2017 | Takizawa |

OTHER PUBLICATIONS

Camsari et al. "Stochastic p-Bits for Invertible Logic." Physical Review X 7, 031014, published on Jul. 20, 2017.
Alaghi et al. "Survey of Stochastic Computing." ACM Transactions on Embedded Computing Systems, vol. 12, No. 2s, Article 92, published May 2013.

* cited by examiner

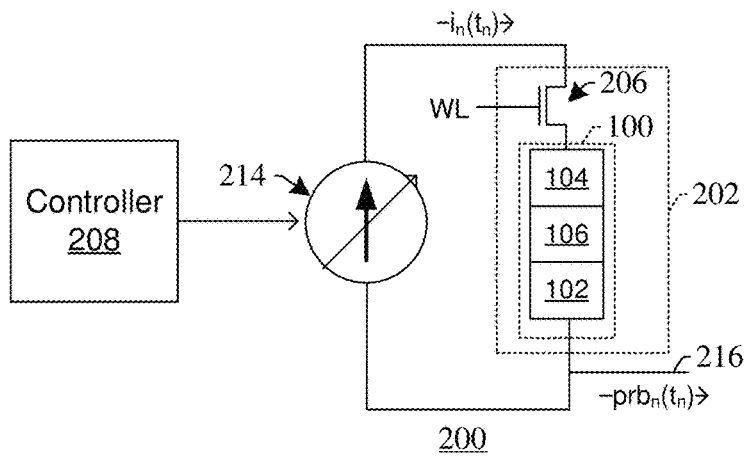
Fig. 2
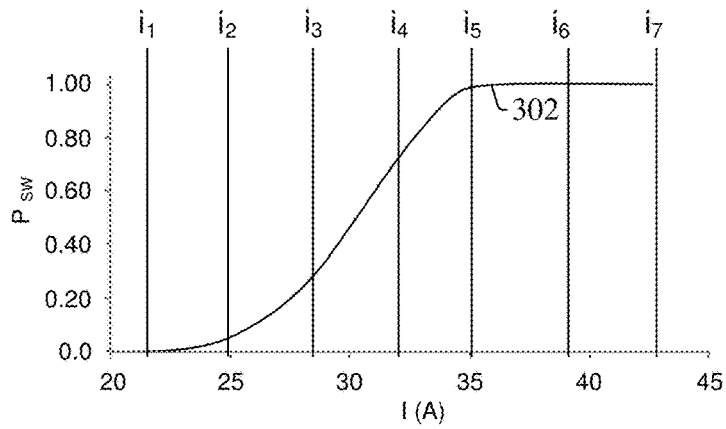
Fig. 3
| Predetermined Current Pulse Shape | Current Amplitude (A) | MTJ Switching Probability |
|---|---|---|
| $i_1$ | 21.3 | 1.03% |
| $i_2$ | 24.85 | 6.28% |
| $i_3$ | 28.4 | 28.33% |
| $i_4$ | 31.95 | 71.10% |
| $i_5$ | 35.5 | 95.95% |
| $i_6$ | 39.05 | 99.84% |
| $i_7$ | 42.6 | 99.99% |
Fig. 4

MEMORY DEVICE WITH TUNABLE PROBABILISTIC STATE

REFERENCE TO RELATED APPLICATION

This Application claims the benefit of U.S. Provisional Application No. 62/894,396, filed on Aug. 30, 2019, the contents of which are hereby incorporated by reference in their entirety.

BACKGROUND

This disclosure relates in general to volatile and nonvolatile memory for use in stand-alone memory chips and for memory arrays integrated on to logic chips. More particularly, this disclosure relates to magnetic memory devices for integrated circuits that store information according to the direction of magnetic moments in magnetic film layers within magnetic tunnel junction (MTJ) devices. Such memory is most commonly referred to as magneto-resistive random access memory or MRAM.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 illustrates some embodiments of a probabilistic random number generator including an MTJ memory cell.

FIG. 3 illustrates a plot showing current vs. probability switching percentage in accordance with some embodiments.

FIG. 4 illustrates a chart for a number of predetermined current pulse shapes and MTJ switching probability.

DETAILED DESCRIPTION

Figure 1A:
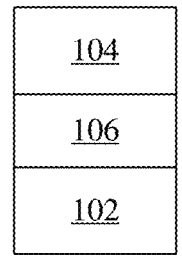
FIG. 1A illustrates some embodiments of a magnetic tunnel junction (MTJ).

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
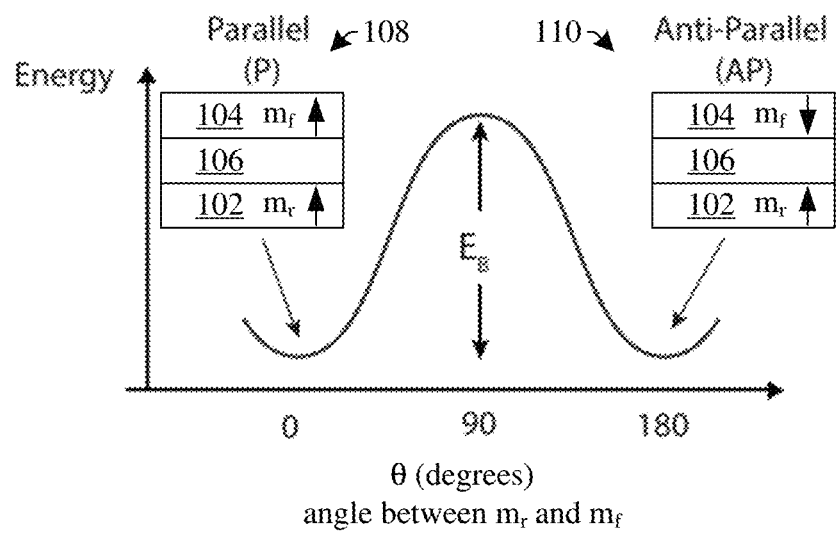
FIG. 1B illustrates some embodiments of an energetic transition between parallel and anti-parallel states for a magnetic tunnel junction (MTJ).

As shown in FIG. 1A, a magnetic tunnel junction (MTJ) 100 includes a first ferromagnetic film 102 and a second ferromagnetic film 104 separated by a thin non-magnetic barrier layer 106, typically a quantum mechanical tunnel barrier layer. The first ferromagnetic film 102 (referred to hereinafter as a "reference layer") has a fixed magnetization direction $m_r$, while the second ferromagnetic film 104 (referred to hereinafter as a "free layer") has a variable magnetization direction $m_f$. As shown in FIG. 1B, if the magnetization direction $m_r$ of the reference layer 102 is aligned with the magnetization direction $m_f$ of the free layer 104, such that the magnetization directions $m_r$ and $m_f$ are in a parallel (P) orientation (see 108), electrons will relatively more easily tunnel through the barrier layer 106, meaning that the MTJ 100 is in a low-resistance state. Conversely, if the magnetization direction $m_r$ of the reference layer 102 is antiparallel with the magnetization direction $m_f$ of the free layer 104, such that $m_r$ and $m_f$ are in an antiparallel (AP) orientation (see 110), electrons will have more difficulty tunneling through the barrier layer 106, meaning that the MTJ 100 is in a high-resistance state. Thus, the MTJ 100 can be switched between these two stable data states of electrical resistance by switching the magnetization direction $m_f$ of the free layer 104. An energy barrier, $E_b$, separates these two stable data states from one another.

State switching (AP to P or P to AP) in the MTJ 100 is accomplished by providing various current pulse shapes to the MTJ 100. For example, when electrons flow up through the reference layer 102, then through the barrier layer 106, then through the free layer 104, the magnetization direction of the free layer 104 can be switched from pointing down to pointing up. However, there is a probabilistic component to this switching in real-world applications as the magnitude and/or pulse width of the current pulse shape becomes smaller/faster. For example, for a current pulse shape with a relatively large current amplitude and relatively long pulse width, the state of the free layer 104 may be switched for essentially 100% of write operations; while for a write current pulse with a relatively small current amplitude and a relatively small pulse width, the magnetization direction of the free layer may be switched for essentially 0% of write operations. This suggests that write current pulses with intermediate current amplitudes and intermediate pulse widths result in the magnetization direction $m_f$ of the free layer 104 being less certain (and hence data states written to the cell are somewhat uncertain for such intermediate amplitudes and intermediate pulse widths).

The present disclosure takes advantage of this to provide an MTJ memory cell that delivers one or more probabilistic random bits at its output. More particularly, a current level provided to the MTJ cell is chosen to be one of a plurality of pre-determined current pulse shapes, with each predetermined current pulse shape corresponding to a different switching probability for the MTJ. When these pre-determined current pulse shapes are used to carry out various write operations to the MTJ over time, the MTJ outputs different data states, with each data state being a random value that follows a switching probability corresponding to the pre-determined current pulse shape used to perform that write operation.

FIG. 2 illustrates some embodiments of a probabilistic random number generator 200 including an MTJ memory cell 202. The MTJ memory cell 202 includes a magnetic tunnel junction (MTJ) 100 and an access transistor 206, such as a metal-oxide semiconductor field effect transistor (MOSFET). The MTJ 100 includes a reference layer 102 and a free layer 104, with a barrier layer 106 such as a non-ferromagnetic tunnel barrier layer separating the ferromagnetic reference layer 102 from the free layer 104, such as previously described with regards to FIGS. 1A-1B. A variable current source 214 is coupled to the access transistor 206 and is configured to provide in time a plurality of predetermined current pulse shapes $i_n(t_n)$, respectively, to the MTJ 100 through the access transistor 206. When applied to the MTJ 100 over a plurality of respective time slots, the predetermined current pulse shapes generate a bit stream at an output 216 of from the MTJ 100. This bit stream includes a plurality of probabilistic random bits $prb_n(t_n)$, respectively, wherein each probabilistic random bit is generated by a predetermined current pulse shape for a given timeslot. The predetermined current pulse shapes $i_n(t_n)$ have different current amplitudes and/or pulse widths corresponding to different switching probabilities for the MTJ.

For instance, FIG. 3-4 illustrate an example where the variable current source 214 is configured to produce seven (n=7) different predetermined current pulse shapes ($i_1$, $i_2$, $i_3$, $i_4$, $i_5$, $i_6$, $i_7$). In FIG. 3, each predetermined current pulse shape has a current amplitude represented by a vertical line, and each is applied for the same duration (pulse width) as one another in this example. For example, the first predetermined current pulse shape $i_1$ has a fixed current amplitude of 21.3 amperes (A), and each of the predetermined current pulse shapes can have a pulse width ranging from 10 microseconds to 10 nanoseconds. Each predetermined current pulse shape provides a different switching probability for the MTJ to switch from a first stable data state (e.g., logical "0") to a second stable data state (e.g., logical "1"). The switching probability for the MTJ is plotted as a switching probability curve 302 in FIG. 3. Thus, the current pulses in this example have different current amplitudes, and when applied to the MTJ, the current pulses have different switching probabilities to switch the data state of the cell, as defined by the switching probability curve 302. For example, when the first predetermined current pulse shape $i_1$ (e.g., 21.3 A) is applied to the MTJ 100, the cell has a 1.03% chance of switching, but when the fourth predetermined current pulse shape $i_4$ (e.g., 31.95 A) is applied to the MTJ, the cell has a 71.10% chance of switching.

In some embodiments, the probability of an MTJ of the memory cell to switch is defined by the following expression:

$$P_{sw} = 1 - \exp^{-\frac{t}{t_0}\exp\left[-\frac{E_b}{K_bT}\left(1-\frac{I_c}{I_{c0}}\right)^2\right]},$$

where $P_{sw}$ is the probability of the MTJ to switch from one data state to another, t is the time the current pulse is applied, $t_0$ is a fixed relaxation time of the free layer of the MTJ file to relax from an intermediate state to either of the stable data states, $E_b$ is the energy bandgap between the stable data states, $K_b$ is Boltzmann constant (e.g., 1.38064852×10$^{-23}$ m$^2$kgs$^{-2}$K$^{-1}$), T is the temperature, $I_c$ is the amplitude of the predetermined current pulse shape applied, and $I_{c0}$ is the so-called "critical current", which is a fixed current value typically needed to switch the data state of the MTJ.

As illustrated in FIG. 4, the first current pulse shape $i_1$ corresponds to a 1.03% chance of switching the MTJ from a first data state (e.g., AP state) to a second data state (e.g., P state), and thus also corresponds to a 98.97% chance of leaving the MTJ in its present state (e.g., remains in AP state). The second current pulse shape $i_2$ corresponds to a 6.28% chance of switching the MTJ from the first data state (e.g., AP state) to the second data state (e.g., P state), and thus also corresponds to a 93.72% chance of leaving the MTJ in its present state (e.g., remains in AP state). The third current pulse shape $i_3$ corresponds to a 28.33% chance of switching the MTJ from the first data state (e.g., AP state) to the second data state (e.g., P state), and thus also corresponds to an 81.67% chance of leaving the MTJ in its present state (e.g., remains in AP state). The fourth current pulse shape $i_4$ corresponds to a 71.10% chance of switching the MTJ from the first data state (e.g., AP state) to the second data state (e.g., P state), and thus also corresponds to a 28.90% chance of leaving the MTJ in its present state (e.g., remains in AP state). The fifth current pulse shape $i_5$ corresponds to a 95.95% chance of switching the MTJ from the first data state (e.g., AP state) to the second data state (e.g., P state), and thus also corresponds to a 4.05% chance of leaving the MTJ in its present state (e.g., remains in AP state). The sixth current pulse shape $i_6$ corresponds to a 99.84% chance of switching the MTJ from the first data state (e.g., AP state) to the second data state (e.g., P state), and thus also corresponds to a 0.16% chance of leaving the MTJ in its present state (e.g., remains in AP state). The seventh current pulse shape $i_7$ corresponds to a 99.99% chance of switching the MTJ from the first data state (e.g., AP state) to the second data state (e.g., P state), and thus corresponds to a 0.01% chance of leaving the MTJ in its present state (e.g., remains in AP state). These current pulse shapes of FIGS. 3-4 are merely non-limiting examples and other current pulse shapes could be used in other embodiments. For instance, in some examples, the plurality of current pulse shapes can induce the MTJ to switch from the first data state to the second data state with a probability of between 10% and 90%, while in other examples the plurality of current pulse shapes can induce the MTJ to switch from the first data state to the second data state with a probability of between 5% and 95%.

Thus, referring back to FIG. 2, during a first time slot ($t_1$), the variable current source 214 can apply a first predetermined current shape $i_1(t_1)$ (e.g., 21.3 A) to the MTJ 100, thereby inducing the MTJ 100 to output a first probabilistic random bit $prb_1(t_1)$ (e.g., 1.03% bit switched to AP state, 98.97% bit remains un-switched in P state). The first probabilistic random bit is "random", meaning that if the predetermined current shape is applied multiple times to an MTJ and the MTJ is then read, the resultant probabilistic random bit read from the MTJ will vary due to the unpredictable change in state of the MTJ each time the first predetermined current shape is applied. Accordingly, even though the same first predetermined current shape is applied each time, the first probabilistic data state is "random" meaning that sometimes the first probabilistic random bit that is read from the MTJ will be a "1", and other times the first probabilistic random bit that is read from the MTJ will be a "0". The first probabilistic data state is also "probabilistic" meaning that its randomness for each predetermined current shape follows a weighted distribution of whether the resultant state is a "1" or "0", and the weighted distribution is based on amplitude and/or pulse width of the first predetermined current shape.

Similarly, during a second time slot ($t_2$), the variable current source 214 can apply a second predetermined current shape $i_2(t_2)$ (e.g., 24.85 A) to the MTJ 100, thereby inducing the MTJ to output a second probabilistic random bit $prb_2(t_2)$. In the example of FIG. 2-3, the second predetermined current shape $i_2(t_2)$ has a 6.28% chance of switching the data state of the MTJ, and a 93.72% chance of leaving the data state of the MTJ unchanged.

During a third time slot ($t_3$), the variable current source 214 can apply a third predetermined current shape $i_3(t_3)$ (e.g., 28.4 A) to the MTJ 100, thereby inducing the MTJ to output a third probabilistic random bit $prb_3(t_3)$. In the example of FIG. 2-3, the third probabilistic random bit has a 28.33% chance of switching the data state of the MTJ, and a 71.67% chance of leaving the data state of the MTJ unchanged.

During a fourth time slot ($t_4$), the variable current source 214 can apply a fourth predetermined current shape $i_4(t_4)$ (e.g., 31.95 A) to the MTJ 100, thereby inducing the MTJ to output a fourth probabilistic random bit $prb_4(t_4)$. In the example of FIG. 2-3, the fourth predetermined current shape $i_4(t_4)$ has a 71.10% chance of switching the data state of the MTJ, and a 29.9% chance of leaving the data state of the MTJ unchanged. A fifth time slot ($t_5$), sixth time slot ($t_6$), and seventh time slot ($t_7$) utilize corresponding predetermined current pulse shapes ($i_5$, $i_6$, $i_7$, respectively), and induce corresponding probabilistic random bits ($prb_5(t_5)$, $prb_6(t_6)$, $prb_7(t_7)$, respectively).

A controller 208 can modulate the current provided by the variable current source 214 in time to produce a bit stream of probabilistic random bits on the output 216, where individual bits and/or the bits of the bit stream as a whole follow a predetermined weighting between "0" states and "1" states. Such a bit stream can be used for modelling, cryptography, and/or other applications.

Further, multiple predetermined current pulse shapes can be successively applied to an MTJ successively to provide a bit whose final probability of being a "1" or "0" is based on the probabilities each predetermined current pulse shape applied to the MTJ. For example, consider a first case where the MTJ is known to initially be in a "0" state. Upon the third predetermined current pulse shape i3 being applied to the MTJ state, the MTJ has a 28.33% chance of flipping to a "1" state. However, if the MTJ is not read, but rather another third predetermined current pulse shape i3 is applied to the MTJ state, the MTJ now has a 28.33%+28.33%*28.33% chance (i.e., a 36.36% chance) of switching to the "1" state. This is because the first time the third predetermined current pulse shape $i_3$ is applied provides a 28.33% chance of flipping the cell, and the second time the third predetermined current pulse shape $i_3$ is applied adds some smaller additional probability (i.e., a 28.33%*28.33% chance=8.026% chance) that the MTJ will flip. Thus, by applying successive predetermined current pulse shapes to the MTJ in time, additional probabilities can be generated aside from those illustrated in FIG. 4. Because this approach allows more probabilities to be generated with a smaller set of predetermined current amplitudes, this is advantageous in situations where simpler hardware (e.g., smaller footprint hardware with fewer transistors) are desired. As a further example, consider a second case where the MTJ is known to initially be in a "0" state. Though FIG. 4 does not illustrate a predetermined current pulse shape that delivers an MTJ switching probability of 50%, it is noted that if two successive predetermined current pulse shapes of $i_3$ and $i_4$ are applied to the MTJ without a read occurring there between, the resultant probability of the MTJ flipping is nearly 50%. More particularly, the probability of $i_3$ flipping the cell is 28.33%, and then when $i_4$ is applied the total probability of the cell flipping is increased by an additional 28.33%*71.10% (i.e., is increased by 20.11%), such that the total probability of the MTJ flipping is 48.44% (i.e., 28.33%+20.11%). Again, this can allow a small subset of predetermined current pulse shapes to deliver a bit stream that exhibits a wide array of probabilistic random values.

Although FIGS. 2-4 have been described above with respect to an example where n=7 predetermined current pulse shapes, it will be appreciated that in general n can be any positive integer value. In addition, it will be appreciated that although the n=7 predetermined current pulse shapes that are illustrated are used for generating probabilistic random bits, additional current pulse shapes can be generated by the for traditional read and write operations. Compared to the current pulse shapes used to generate the probabilistic random bits, the traditional write operations make use of a first write current pulse shape that switches the MTJ from the first data state to the second data state with at least 99.99% probability; and make use of a second write current pulse shape that switches the MTJ from the second data state to the first data state with at least 99.99% probability. Thus, the variable current source can generate a first write current pulse shape to definitively switch the MTJ from the first data state to the second data state, a second write current pulse shape to definitively switch the MTJ from the second data state to the first data state, and a plurality of current pulse shapes that provide probabilistic random bits at the output of the MTJ in time.

Further still, although this disclosure is described primarily with regards to MTJs, in other embodiments, other types of resistive memory cell that include a variable resistor, such as ferroelectric memory, resistive random access memory (RRAM), and/or phase change memory, among others, are contemplated as falling within the scope of the present disclosure.

Figure 5:
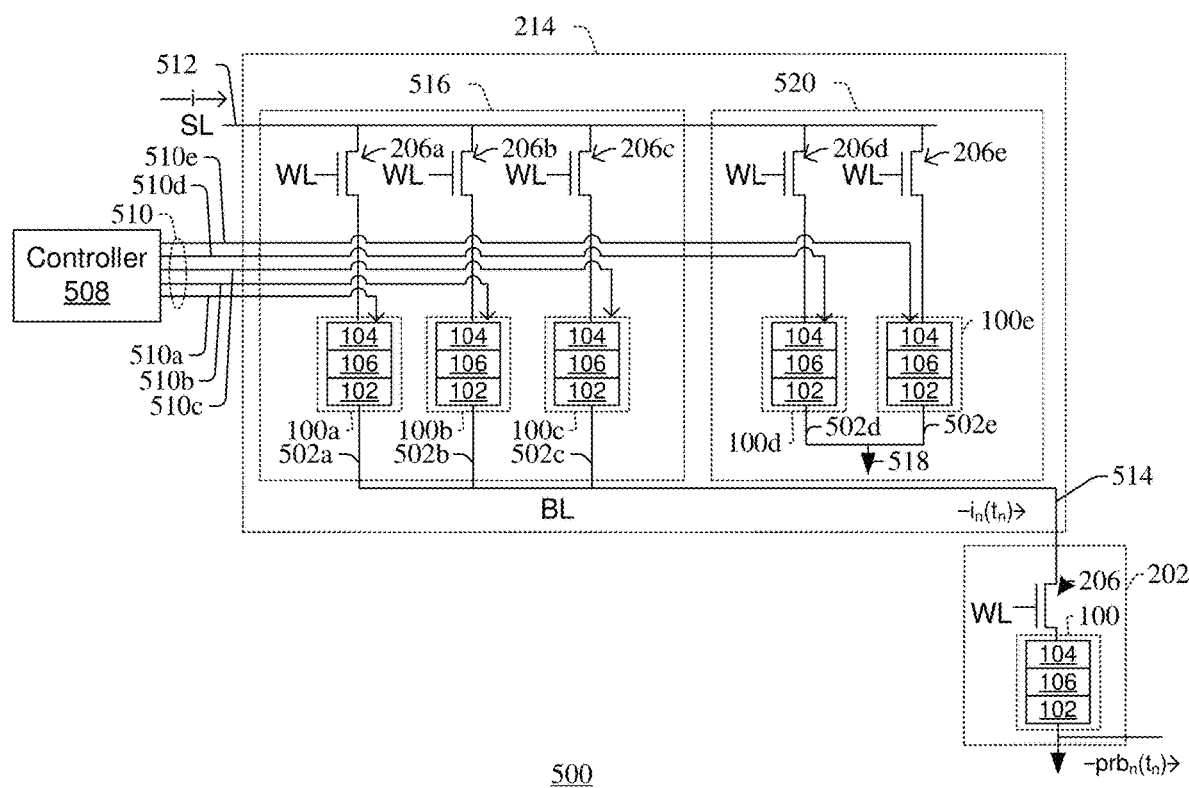
FIG. 5 illustrates some embodiments of a probabilistic random number generator including an MTJ memory cell.

FIG. 5 illustrates a more detailed example of a probabilistic random number generator 200 including an MTJ memory cell 202. In this example, the variable current source 214 comprises a plurality of current paths 502a-502e disposed in parallel with one another. A plurality of MTJs 100a-100e, respectively, and a plurality of transistors 206a-206e, respectively, are arranged on the plurality of current paths 502a-502e, respectively. Each current path includes a respective transistor and a respective MTJ arranged in series on that current path.

A controller 508 is configured to write a multi-bit digital code on control line(s) 510 to the plurality of MTJs 100a-100e, wherein a value of the multi-bit digital code selects a predetermined current pulse shape from the plurality of predetermined current pulse shapes to be applied to the MTJ 202 to induce generation of a probabilistic random bit. For example, in FIG. 5's embodiment, there are five current paths and five corresponding MTJs. An input current terminal 512 of the variable current source 214 is coupled to each of the plurality of current paths, such that the plurality of current paths 502a-502e branch off of the input current terminal 512. An output current terminal 514 is coupled to a first subset 516 of the plurality of current paths; and a ground terminal 518 is coupled to a second subset 520 of the plurality of current paths. The access transistor 206 of the MTJ cell 202 includes a first source/drain region, a second source/drain region, and a gate disposed between the first and second source/drain regions. The first source/drain region of the access transistor is coupled to the MTJ 100 and the second source/drain region of the access transistor is coupled to the output current terminal 514.

During operation, each MTJ 100a-100e can be in one of two resistance states: a high-resistance state (e.g., an antiparallel state), which can be induced by writing a first data state (e.g., logical "1") to that MTJ; or a low-resistance state (e.g., a parallel state), which can be induced by writing a second data state (e.g., logical "0") to that MTJ. Thus, the "0" and/or "1" written to these MTJs 100a-100e are of sufficiently large current (e.g., greater than 200µ A) to flip the states of the MTJs with essentially 100% probability, and the multi-bit digital code provided to the plurality of MTJs 100a-100e sets the predetermined current pulse shape that is provided to the MTJ memory cell 202. Because of the various resistances of the MTJs, when a current pulse i is applied to the input terminal 512; a first portion of the current pulse is directed through the first subset 516 of the current paths, and a second portion of the current pulse is diverted to ground through the second subset 520 of the plurality of current paths. The extent to which the first portion of the current pulse is bigger than the second portion of the current pulse (or vice versa) is based on the relative resistances of the MTJs 100a-100e in the first subset 516 of current paths and the second subset 520 of current paths.

Thus, for example, writing a first multi-bit digital code of "11001" on control line(s) 510 in a first time slot would place the first MTJ 100a in a high-resistance data state, the second MTJ 100b in a high-resistance data state, the third MTJ 100c in a low-resistance data state, the fourth MTJ 100d in a low-resistance data state, and the fifth MTJ 100e in a high-resistance data state. Because of the resistances of the MTJs, when a current pulse i is applied to the input terminal 512, this first multi-bit digital code provides a first predetermined current pulse $i_1$ to the MTJ cell 202, which has a first probability of switching the MTJ cell. Thus, for the first time slot, the MTJ cell 202 stores a first probabilistic random bit.

Writing a second multi-bit digital code of "00011" in a second time slot would place the first MTJ 100a in a low-resistance data state, the second MTJ 100b in a low-resistance data state, the third MTJ 100c in a low-resistance data state, the fourth MTJ 100d in a high-resistance data state, and the fifth MTJ 100e in a high-resistance data state. Because of the resistances of the MTJs, this second multi-bit digital code provides a second predetermined current pulse $i_2$ to the MTJ cell 202, which has a second probability of switching the MTJ cell. In this example, the second probability can be greater than the first probability, such that for the second time slot, the MTJ cell 202 stores a second probabilistic random bit that is more likely to switch the MTJ cell than the first multi-bit digital code.

Writing a third multi-bit digital code of "11100" in a third time slot would place the first MTJ 100a in a high-resistance data state, the second MTJ 100b in a high-resistance data state, the third MTJ 100c in a high-resistance data state, the fourth MTJ 100d in a low-resistance data state, and the fifth MTJ 100e in a low-resistance data state. Because of the resistances of the MTJs, this third multi-bit digital code provides a third predetermined current pulse to the MTJ cell 202, which has a third probability of switching the MTJ cell. In this example, the third probability can be less than the first probability, such that for the third time slot, the MTJ cell 202 stores a third probabilistic random bit that is less likely to switch the MTJ cell than the first multi-bit digital code. By reading the MTJ cell 202 after each write operation, a bit stream made up of a number of probabilistic random bits is formed.

Figure 7:
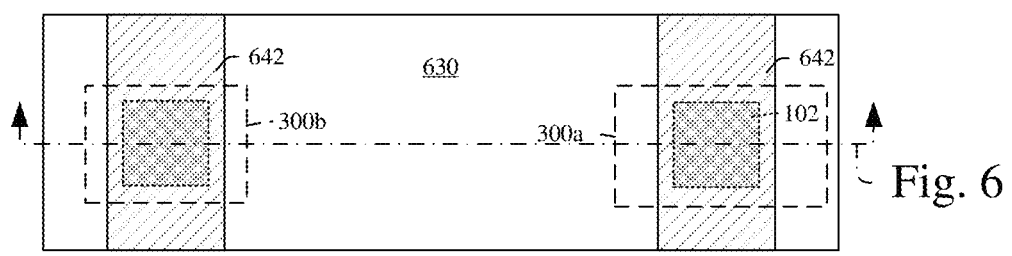
FIG. 7 shows some embodiments of a top view of an MRAM device consistent with FIG. 6.

FIG. 7 illustrates a cross sectional view of some embodiments of an MRAM integrated circuit 600, which include ferromagnetic memory stacks 300a, 300b disposed in an interconnect structure 604 of the integrated circuit 600. The integrated circuit 600 includes a substrate 606. The substrate 606 may be, for example, a bulk substrate (e.g., a bulk silicon substrate) or a silicon-on-insulator (SOI) substrate. The illustrated embodiment depicts one or more shallow trench isolation (STI) regions 608, which may include a dielectric-filled trench within the substrate 606.

Two word line (WL) transistors 610, 612 are disposed between the STI regions 608. The word line transistors 610, 612 include word line gate electrodes 614, 616, respectively; word line gate dielectrics 618, 620, respectively; word line sidewall spacers 622; and source/drain regions 624. The source/drain regions 624 are disposed within the substrate 606 between the word line gate electrodes 614, 616 and the STI regions 608, and are doped to have a first conductivity type which is opposite a second conductivity type of a channel region under the gate dielectrics 618, 620, respectively. The word line gate electrodes 614, 616 may be, for example, doped polysilicon or a metal, such as aluminum, copper, or combinations thereof. The word line gate dielectrics 618, 620 may be, for example, an oxide, such as silicon dioxide, or a high-k dielectric material. The word line sidewall spacers 622 can be made of silicon nitride (e.g., $Si_3N_4$), for example.

The interconnect structure 604 is arranged over the substrate 606 and couples devices (e.g., transistors 610, 612) to one another. The interconnect structure 604 includes a plurality of IMD layers 626, 628, 630, and a plurality of metallization layers 632, 634, 636 which are layered over one another in alternating fashion. The IMD layers 626, 628, 630 may be made, for example, of a low κ dielectric, such as un-doped silicate glass, or an oxide, such as silicon dioxide, or an extreme low-k dielectric layer. The metallization layers 632, 634, 636 include metal lines 638, 640, 642, which are formed within trenches, and which may be made of a metal, such as copper or aluminum. Contacts 644 extend from the bottom metallization layer 632 to the source/drain regions 624 and/or gate electrodes 614, 616; and vias 646 extend between the metallization layers 632, 634, 636. The contacts 644 and the vias 646 extend through dielectric-protection layers 650, 652 (which can be made of dielectric material and can act as etch stop layers during manufacturing). The dielectric-protection layers 650, 652 may be made of an extreme low-k dielectric material, such as SiC, for example. The contacts 644 and the vias 646 may be made of a metal, such as copper or tungsten, for example.

The MRAM ferromagnetic memory stacks 300a, 300b are configured to store respective data states, and are arranged within the interconnect structure 604 between neighboring metal layers. The MRAM ferromagnetic memory stack 300a includes a bottom electrode 654 and a top electrode 656, which are made of conductive material. In some embodiments, the bottom electrode 654 may comprise tantalum (Ta), tantalum nitride (TaN), or ruthenium (Ru), for example; and the top electrode 656 may comprise tantalum (Ta), tantalum nitride (TaN), or ruthenium (Ru), for example. The bottom electrode 132 and the top electrode 656 can be the same material or different materials depending on the implementation.

The MRAM ferromagnetic memory stacks 300a, 300b each further comprise a reference layer 102 disposed over the bottom electrode 654, and a free layer 104 disposed over the reference layer 102 and separated from the reference layer 102 by a barrier layer 106. The reference layer 102 is a ferromagnetic layer that has a magnetization direction that is "fixed". As an example, the magnetization direction of the reference layer 102 can be "up", i.e., perpendicular to the plane of the reference layer 102 pointing to the top electrode 136, but can also be "in-plane" in other embodiments, i.e., within the plane of the reference layer 102. The barrier layer 106, which can manifest as a thin dielectric layer or non-magnetic metal layer in some cases, separates the reference layer 102 from the free layer 104. The barrier layer 106 can be a tunnel barrier which is thin enough to allow quantum mechanical tunnelling of current between the reference layer 102 and the free layer 104. In some embodiments, the barrier layer 106 can comprise an amorphous barrier, such as aluminum oxide ($AlO_x$), or titanium oxide ($TiO_x$), or a crystalline barrier, such as magnesium oxide (MgO) or a spinel (e.g., $MgAl_2O_4$). The free layer 104 and the reference layer 102 can comprise iron, cobalt, nickel, iron cobalt, nickel cobalt, cobalt iron boride, iron boride, iron platinum, iron palladium, or the like. As an example, the free layer 104 and the reference layer 102 may respectively comprise a cobalt iron boron (CoFeB) layer. The free layer 104 is capable of changing its magnetization direction between one of two magnetization states, which correspond to binary data states stored in the MTJ. For example, in a first state, the free layer 104 can have an "up" magnetization direction in which the magnetization direction of the free layer 104 is aligned in parallel with the magnetization direction of the reference layer 102, thereby providing the MTJ stack with a relatively low resistance. In a second state, the free layer 104 can have a "down" magnetization direction which is aligned and anti-paralleled with the magnetization direction of the reference layer 102, thereby providing the MTJ stack with a relatively high resistance.

In some embodiments, the free layer 104 may comprise a magnetic metal, such as iron, nickel, cobalt, boron and alloys thereof, for example, such as a CoFeB ferromagnetic free layer.

Further in some embodiments, a synthetic anti-ferromagnetic (SyAF) layer 109 is disposed under the reference layer 102 or at one side of the reference layer 102 opposite to the free layer 104. The SyAF layer 109 is made of a ferromagnetic material having a constrained or "fixed" magnetization direction. This "fixed" magnetization direction can be achieved in some cases by an initializing exposure to a high magnetic field after the entire chip is manufactured.

Figure 6:
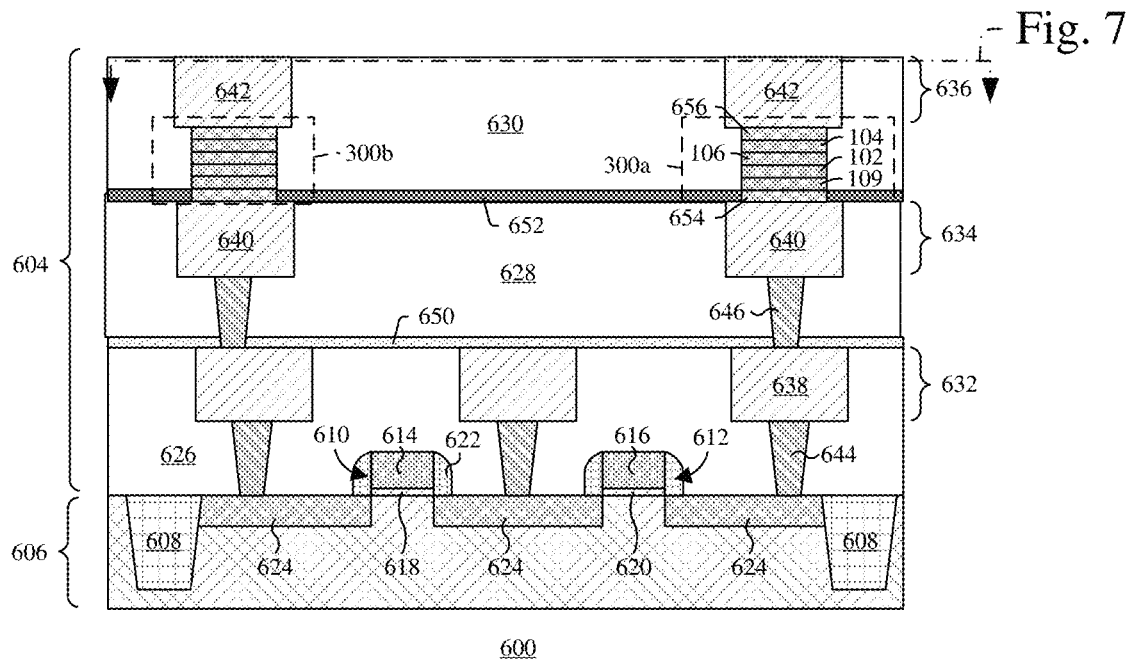
FIG. 6 shows some embodiments of a cross-sectional view of an MRAM device.

FIG. 7 depicts some embodiments of a top view of FIG. 6's integrated circuit 600 as indicated in the cut-away lines shown in FIGS. 6-7. As can be seen, the ferromagnetic memory stacks 300a, 300b can have a square shape when viewed from above in some embodiments. In other embodiments, however, for example due to practicalities of many etch processes, the corners of the illustrated square shape can become rounded, resulting in MRAM ferromagnetic memory stacks 300a, 300b having a square shape with rounded corners, or having a circular shape. The MRAM ferromagnetic memory stacks 300a, 300b are arranged over metal lines 640, respectively, and have top electrodes 656 in direct electrical connection with the metal lines 642, respectively, without vias or contacts there between in some embodiments. In other embodiments, vias or contacts couple the top electrodes 656 to the metal lines 642.

Figure 8:
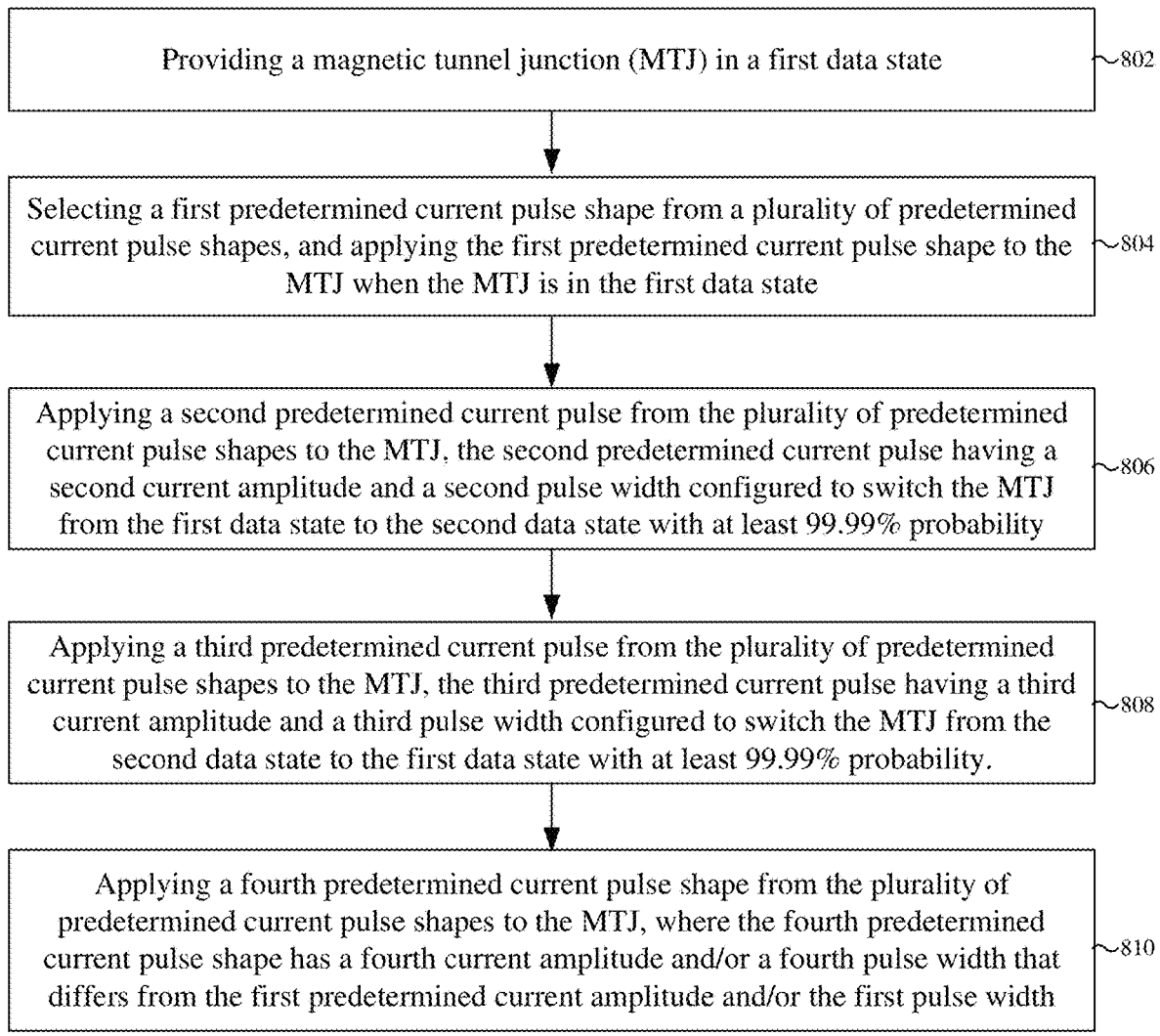
FIG. 8 shows a method of generating a bit stream in accordance with some embodiments.

FIG. 8 illustrates a method 800 of generating a bit stream in accordance with some embodiments. Although FIG. 8 is described as a series of acts, it will be appreciated that these acts are not limiting in that the order of the acts can be altered in other embodiments, and the methods disclosed are not limited by the structure disclosed herein. In other embodiments, some acts that are illustrated and/or described may be omitted in whole or in part.

In 802, an MTJ is provided in a first data state.

In 804, a first predetermined current pulse shape is selected from a plurality of predetermined current pulse shapes, and the first predetermined current pulse shape is applied to the MTJ when the MTJ is in the first data state. The predetermined current pulse shapes have different current amplitudes and/or pulse widths corresponding to different switching probabilities to switch the MTJ from the first data state to a second data state. In some embodiments, the first predetermined current pulse is configured to switch the MTJ from the first data state to the second data state with a first switching probability of between 5% and 95%. Thus, the first predetermined current pulse shape can provide a first probabilistic random bit from the MTJ, with the first probabilistic random bit having a first data state that is somewhat uncertain until read.

In 806, a second predetermined current pulse from the plurality of predetermined current pulse shapes is applied to the MTJ to write the second data state to the MTJ. The second predetermined current pulse has a second current amplitude and a second pulse width, and is configured to switch the MTJ from the first data state to the second data state with at least 99.99% probability. Thus, the second predetermined current pulse shape can provide a second data state that is essentially certain from the MTJ, such as a logical "1" state for example.

In 808, a third predetermined current pulse from the plurality of predetermined current pulse shapes is applied to the MTJ. The third predetermined current pulse has a third current amplitude and a third pulse width, and is configured to switch the MTJ from the second data state to the first data state with at least 99.99% probability. Thus, the third predetermined current pulse shape can provide a third data state that is essentially certain from the MTJ, such as a logical "0" state for example.

In 810, a fourth predetermined current pulse shape from the plurality of predetermined current pulse shapes is applied to the MTJ. The fourth predetermined current pulse shape has a fourth current amplitude and/or a fourth pulse width that differs from the first predetermined current amplitude and/or the first pulse width. In some embodiments, the fourth predetermined current pulse is configured to switch the MTJ from the first data state to the second data state with a first switching probability of between 5% and 95%. Thus, the fourth predetermined current pulse shape can provide a second probabilistic random bit from the MTJ, with the second probabilistic random bit having a fourth data state that is somewhat uncertain until read.

Some embodiments relate to a probabilistic random number generator. The probabilistic random number generator includes a memory cell that includes a magnetic tunnel junction (MTJ). A variable current source is coupled to the MTJ. The variable current source is configured to provide a plurality of predetermined current pulse shapes, respectively, to the MTJ in a plurality of time slots, respectively, to generate a bit stream including a plurality of probabilistic random bits, respectively. The predetermined current pulse shapes have different current amplitudes and/or pulse widths corresponding to different switching probabilities for the MTJ.

Some other embodiments relate to a method of generating a bitstream of data comprising probabilistic random bits. In the method, a magnetic tunnel junction (MTJ) in a first data state is provided. A first predetermined current pulse shape is selected from a plurality of predetermined current pulse shapes, and is applied to the MTJ when the MTJ is in the first data state. The predetermined current pulse shapes have different current amplitudes and/or pulse widths corresponding to different switching probabilities to switch the MTJ from the first data state to a second data state.

Still other embodiments pertain to a probabilistic random number generator. The probabilistic random number generator includes a memory cell including a variable resistor configured to switch between a first stable data state corresponding to a first resistance and a second stable data state corresponding to a second resistance. The second resistance differs from the first resistance. A variable current source is coupled to the variable resistor and is configured to provide a plurality of predetermined current pulse shapes. A controller is configured to write the first stable data state to the memory cell by applying a first current pulse shape of the plurality of predetermined current pulse shapes to the variable resistor during a first time slot, to write the second stable data state to the variable resistor by applying a second current pulse shape of the plurality of predetermined current pulse shapes to the memory cell during a second time slot, and to write a probabilistic random data state to the variable resistor by applying a third current pulse shape of the plurality of predetermined current pulse shapes to the variable resistor during a third time slot.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A probabilistic random number generator, comprising:
a memory cell comprising a magnetic tunnel junction (MTJ); and
a variable current source coupled to the MTJ, the variable current source configured to provide a plurality of predetermined current pulse shapes, respectively, to the MTJ in a plurality of time slots, respectively, to generate a bit stream including a plurality of probabilistic random bits, respectively, where the predetermined current pulse shapes have different current amplitudes and/or pulse widths corresponding to different switching probabilities for the MTJ.

2. The probabilistic random number generator of claim 1, wherein the plurality of predetermined current pulse shapes includes at least three different predetermined current pulse shapes corresponding to at least three different respective switching probabilities for the MTJ.

3. The probabilistic random number generator of claim 1, further comprising:
a controller configured to select a predetermined current pulse shape from the plurality of predetermined current pulse shapes to induce the MTJ to switch from a first data state to a second data state according to a probabilistic random value, the probabilistic random value being between 10% and 90% for the MTJ to switch from the first data state to the second data state.

4. The probabilistic random number generator of claim 3:
wherein a first predetermined current pulse shape has a first amplitude and/or a first pulse width corresponding to a first switching probability of the MTJ switching from the first data state to the second data state, and
wherein a second predetermined current pulse shape has a second amplitude and/or a second pulse width corresponding to a second switching probability of the MTJ switching from the first data state to the second data state, the second switching probability differing from the first switching probability.

5. The probabilistic random number generator of claim 4, wherein the first amplitude and/or the first pulse width is less than the second amplitude and/or the second pulse width and the first switching probability is less than the second switching probability.

6. The probabilistic random number generator of claim 4, wherein the first switching probability is between 10% and 90%, and wherein the second switching probability is also between 10% and 90% but differs from the first switching probability.

7. The probabilistic random number generator of claim 4:
wherein a third predetermined current pulse from the plurality of predetermined current pulse shapes has a third current amplitude and a third pulse width configured to switch the MTJ from the first data state to the second data state with at least 99.99% probability; and
wherein a fourth predetermined current pulse from the plurality of predetermined current pulse shapes has a fourth current amplitude and a fourth pulse width configured to switch the MTJ from the second data state to the first data state with at least 99.99% probability.

8. The probabilistic random number generator of claim 1, wherein the variable current source comprises:
a plurality of current paths disposed in parallel with one another;
a plurality of MTJs on the plurality of current paths, respectively; and
a plurality of transistors arranged on the plurality of current paths, respectively, wherein each current path includes a respective transistor and a respective MTJ arranged in series on that current path.

9. The probabilistic random number generator of claim 8, further comprising:
a controller configured to write a multi-bit digital code to the plurality of MTJs, wherein a value of the multi-bit digital code selects a predetermined current pulse shape from the plurality of predetermined current pulse shapes to be applied to the MTJ to induce generation of a probabilistic random bit.

10. The probabilistic random number generator of claim 8, wherein the variable current source further comprises:
an input current terminal coupled to the plurality of current paths, wherein the plurality of current paths branch off the input current terminal;
an output current terminal coupled to a first subset of the plurality of current paths; and
a ground terminal coupled to a second subset of the plurality of current paths.

11. The probabilistic random number generator of claim 10, further comprising:
an access transistor coupled between the MTJ and the output current terminal, the access transistor comprising a first source/drain region, a second source/drain region, and a gate disposed between the first and second source/drain regions, the first source/drain region of the access transistor being coupled to the MTJ and the second source/drain region of the access transistor being coupled to the output current terminal.

12. The probabilistic random number generator of claim 1, wherein the MTJ comprises:
a ferromagnetic free layer;
a non-magnetic barrier layer overlying the ferromagnetic free layer; and
a ferromagnetic reference layer overlying the non-magnetic barrier layer.

13. A method of generating a bitstream of data comprising probabilistic random bits, comprising:
providing a magnetic tunnel junction (MTJ) in a first data state; and
selecting a first predetermined current pulse shape from a plurality of predetermined current pulse shapes, and applying the first predetermined current pulse shape to the MTJ when the MTJ is in the first data state;
wherein the predetermined current pulse shapes have different current amplitudes and/or pulse widths corresponding to different switching probabilities to switch the MTJ from the first data state to a second data state.

14. The method of claim 13, wherein the first predetermined current pulse shape is configured to switch the MTJ from the first data state to the second data state with a first switching probability of between 5% and 95%.

15. The method of claim 14, further comprising:
applying a fourth predetermined current pulse shape from the plurality of predetermined current pulse shapes to the MTJ, where the fourth predetermined current pulse shape has a fourth current amplitude and/or a fourth pulse width that differs from a first predetermined current amplitude and/or a first pulse width of the first predetermined current pulse shape.

16. The method of claim 15, wherein the fourth predetermined current pulse shape is configured to switch the MTJ from the first data state to the second data state with a second switching probability of between 5% and 95%, the second switching probability differing from the first switching probability.

17. The method of claim 13, further comprising:
applying a second predetermined current pulse from the plurality of predetermined current pulse shapes to the MTJ, the second predetermined current pulse having a second current amplitude and a second pulse width configured to switch the MTJ from the first data state to the second data state with at least 99.99% probability.

18. The method of claim 17, further comprising:
applying a third predetermined current pulse from the plurality of predetermined current pulse shapes to the MTJ, the third predetermined current pulse having a third current amplitude and a third pulse width configured to switch the MTJ from the second data state to the first data state with at least 99.99% probability.

19. A probabilistic random number generator, comprising:
a memory cell comprising a variable resistor configured to switch between a first stable data state corresponding to a first resistance and a second stable data state corresponding to a second resistance, the second resistance differing from the first resistance;
a variable current source coupled to the variable resistor and configured to provide a plurality of predetermined current pulse shapes; and
a controller configured to write the first stable data state to the memory cell by applying a first predetermined current pulse shape of the plurality of predetermined current pulse shapes to the variable resistor during a first time slot, to write the second stable data state to the variable resistor by applying a second predetermined current pulse shape of the plurality of predetermined current pulse shapes to the memory cell during a second time slot, and to write a probabilistic random data state to the variable resistor by applying a third predetermined current pulse shape of the plurality of predetermined current pulse shapes to the variable resistor during a third time slot.

20. The probabilistic random number generator of claim 19, wherein the first predetermined current pulse shape is configured to switch the variable resistor from the second stable data state to the first stable data state with at least 99.99% probability; the second predetermined current pulse shape is configured to switch the variable resistor from the first stable data state to the second stable data state with at least 99.99% probability; and the third predetermined current pulse shape is configured to switch the variable resistor from the first stable data state to the second stable data state with a probability of between 5% and 95%.

* * * * *